United States Patent
Beck et al.

(10) Patent No.: US 7,452,804 B2
(45) Date of Patent: Nov. 18, 2008

(54) SINGLE DAMASCENE WITH DISPOSABLE STENCIL AND METHOD THEREFORE

(75) Inventors: Michael Beck, Poughkeepsie, NY (US); Bee Kim Hong, Beacon, NY (US); Armin Tilke, Beacon, NY (US); Hermann Wendt, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 295 days.

(21) Appl. No.: 11/204,982

(22) Filed: Aug. 16, 2005

(65) Prior Publication Data

US 2007/0042588 A1  Feb. 22, 2007

(51) Int. Cl.
*H01L 21/00* (2006.01)
(52) U.S. Cl. .......... 438/627; 438/926; 257/E21.585
(58) Field of Classification Search ................ 438/623, 438/926, 627, 629
See application file for complete search history.

(56) References Cited

U.S. PATENT DOCUMENTS

| | | | | |
|---|---|---|---|---|
| 5,275,973 A | * | 1/1994 | Gelatos | 438/623 |
| 5,695,810 A | * | 12/1997 | Dubin et al. | 438/643 |
| 5,710,061 A | * | 1/1998 | Cleeves | 438/618 |
| 5,854,131 A | * | 12/1998 | Dawson et al. | 438/666 |
| 6,033,977 A | * | 3/2000 | Gutsche et al. | 438/618 |
| 6,355,563 B1 | * | 3/2002 | Cha et al. | 438/687 |
| 6,403,461 B1 | * | 6/2002 | Tae et al. | 438/619 |
| 6,429,128 B1 | * | 8/2002 | Besser et al. | 438/687 |
| 7,088,003 B2 | * | 8/2006 | Gates et al. | 257/774 |

* cited by examiner

*Primary Examiner*—Charles D. Garber
*Assistant Examiner*—Reema Patel
(74) *Attorney, Agent, or Firm*—Slater & Matsil, L.L.P.

(57) ABSTRACT

In a method of fabricating a semiconductor device, a liner is deposited over a conductive region of a wafer and a stencil layer is deposited over the liner. The stencil layer and the liner are etched to form a stencil pattern for a conductive layer. A second liner is deposited over exposed surfaces of the stencil pattern, and the exposed horizontal surfaces of the second liner are removed by sputtering. A low-k dielectric layer is then deposited over the wafer, and the wafer is planarized down to the stencil pattern by chemical-mechanical polishing. The stencil pattern is removed with a wet etch to form an aperture in the wafer exposing the liner and remaining portions of the second liner. Metal is deposited in the aperture, and the surface of the wafer is replanarized by chemical-mechanical polishing to produce a planar surface for additional metallization layers that may be deposited.

28 Claims, 3 Drawing Sheets

SINGLE DAMASCENE WITH DISPOSABLE STENCIL AND METHOD THEREFORE

TECHNICAL FIELD

The present invention relates generally to semiconductor devices and methods, and more particularly, to a metal interconnect structure and method.

BACKGROUND

Semiconductors are widely used for integrated circuits for electronic applications, including radios, televisions, and personal computing devices, as examples. Such integrated circuits typically use multiple transistors fabricated in single crystal silicon. It is common for there to be millions of semiconductor devices on a single semiconductor product. To provide the necessary signal and power interconnections for the multiplicity of semiconductor devices, many integrated circuits now include multiple levels of metallization.

The semiconductor industry continuously strives to decrease the size of the semiconductor devices located on integrated circuits. Miniaturization is generally needed to accommodate the increasing density of the circuits necessary for today's advanced semiconductor products. The increasing density has lead to the need for more metallic layers, typically of aluminum and more recently of copper, to provide the circuit interconnections. For CMOS ICs with 250 nm feature size, four metallic layers for interconnections was sufficient. Below 100 nm, nine or more metallic layers will generally be required. With the increasing number of metallic interconnection layers, more manufacturing steps and cost are required to form the interconnections than the transistors and diodes in the semiconductor device. For high complexity, high density chips with six or more layers of metallization, the total length of the layered interconnect wiring in the chip can be of the order of a mile. The signaling speed among on-chip devices provided by these interconnections has become a significant factor in chip performance. The resistance of the interconnecting wiring generally increases as a consequence of its width-height product being reduced faster than its length is shortened, which further aggravates the signaling-speed problem.

A layered and patterned metal interconnect structure is conventionally formed in the upper layers of an integrated circuit to provide the necessary circuit connections for the various semiconductor devices in the integrated circuit such as transistors and diodes. In high-density integrated circuits, damascene techniques are used to form and deposit metal lines and vias for the desired interconnections in a surrounding dielectric layer.

In ordinary damascene processes, trenches and vias are patterned and dry-etched during BEOL processing ("back end of line" processing, which is the processing performed after the first metallic contacts are formed on the die), typically to a depth of about 0.2 to 0.5 μm, in a dielectric layer using lithographic techniques. A trench and/or a via is first lined with a thin liner material such as tantalum, and then entirely filled with a metal, preferably copper in advanced processes. Excess metal deposited outside the trench is removed by a CMP (chemical-mechanical polishing) process, leaving a clean metal line or via substantially planarized with the surrounding dielectric. The via- and trench-forming steps are repeated to produce a number of layers of interconnected metallic lines for the underlying semiconductor devices.

Advanced CMOS processes, particularly CMOS processes producing fine-line structures smaller than 100 nm, employ low-k and ultra-low-k dielectric materials for the intermetallic and intrametallic dielectric layers in order to reduce capacitive coupling between interconnect lines and thereby reduce signaling delays. The parameter "k" is the relative dielectric constant for the material, where a vacuum has a value of one for k. Using a dielectric material with low dielectric constant is thus important in semiconductor devices with reduced feature sizes. But low-k dielectric materials can be difficult to use, and without due care are generally not robust in manufacturing processes. For example, widely used low-k materials generally comprise organic spin-on materials, which must be heated after application to remove the liquid or solvent. Low-k materials generally have a high thermal expansion coefficient compared to metals and silicon dioxide, and have a lower moisture and chemical resistance. These materials with low dielectric constant are not easily etched or cleaned, and are typically damaged by dry-etching processes, causing them to at least partially lose their low-k properties. Porous dielectrics, often used for their low dielectric constant, are particularly prone to these effects, resulting in unreliable or low-performing products.

FIGS. 1 and 2 show prior art structures (layers of dies on wafers) 100 and 160 for prior methods of fabricating multilayer interconnects of an integrated circuit on a semiconductor wafer. FIG. 1 shows a single-damascene approach, and FIG. 2 shows a dual-damascene approach.

Referring first to the structure 100 shown in FIG. 1, a substrate 102 is provided, typically comprising silicon dioxide deposited over single-crystal silicon. The substrate 102 may include other conductive layers or other semiconductor elements, e.g., transistors, diodes, etc. Compound semiconductors such as GaAs, InP, Si/Ge, SiC are often used in place of silicon.

A first dielectric layer 104 is deposited over the substrate 102. In the prior art structure described herein, dielectric 104 comprises a low-dielectric constant material, having a relative dielectric constant k of 3.6 or less, for example. Low-k dielectric material 104 comprises an organic spin-on material such as a polyimide or others. Trademarks for such materials include Dow Chemical Company's SiLK™ and AlliedSignal, Inc.'s Flare™ for example. After depositing a low-k dielectric 104 typically by CVD, the wafer 100 is exposed in a heating step (e.g., baked) to remove the solvents and cure the dielectric material. Temperatures of the heating step may reach 400° C., for example. Other low-k dielectrics can be deposited by chemical vapor deposition.

Dielectric material 104 is patterned and etched, generally using an RIE (reactive ion etch) or other etching process, and conductive lines 108 are formed. An optional conductive liner 106 (which is necessary as a barrier for Cu) may be deposited prior to formation of conductive lines 108. Conductive liner 106 typically comprises Ta, TaN, WN, TiN, etc., and conductive lines 108 may comprise conductive materials such as aluminum, copper, other metals, or combinations thereof, for example.

A dielectric cap layer 110 comprising $Si_3N_4$, for example, is deposited over conductive lines 108 and low-k dielectric 104. A second layer of dielectric material 112 is deposited over conductive lines 108. Second dielectric layer 112 comprises a low-k material and thus is often baked at up to 400° C. to remove solvents. Dielectric layer 112 is patterned, e.g., with a mask, and via openings are formed using an etch process step, preferably an anisotropic etch process which is substantially directed towards the perpendicular surface of the wafer. A small portion of the tops of conductive lines 108 is typically etched during the anisotropic etch process, as shown by the recess at 122.

A metallic liner 117 must be deposited over the a hole for a via and a trench for a metal line. The via openings are filled with a metallic material, preferably the same as the material used for the conductive lines 108, for example, copper, to form vias 116. Vias 116 are typically substantially cylindrical, and may have a slightly greater diameter at the tops than at the bottoms due to the via opening etch process not being entirely perpendicular to the wafer 100 surface.

A third dielectric layer 114 comprising a low-k dielectric material, for example, OMCTS (octamethylcyclotetrasiloxane), is deposited over vias 116, heated to remove the solvents, patterned, and etched. Conductive lines 120 are formed over vias 116 to provide a connection to conductive lines 108 in the underlying first dielectric layer 104. An optional conductive liner 118 may be deposited prior to the formation of conductive lines 120. Conductive lines 120 preferably comprise a metal material the same as conductive lines 108, for example. Many other conductive layers may be deposited in this manner. It is now not uncommon to have six or more conductive layers within a semiconductor structure as the complexity of devices continues to increase.

FIG. 2 shows generally at 160 a prior art dual-damascene approach of forming multi-layer interconnects of an integrated circuit. A substrate 102 is provided, and a first dielectric layer 104 is deposited over the substrate 102. Dielectric material 104 may comprise a low-k dielectric. Dielectric material 104 is patterned and etched, and conductive lines 108 are formed. An optional conductive liner 106 may be deposited prior to formation of conductive lines 108.

A dielectric cap layer 110 is deposited over conductive lines 108 and low-k dielectric 104. A second layer of dielectric material 162 is deposited over conductive lines 108. In a dual damascene approach, second dielectric layer 162 is thicker than in a single-damascene approach, because both via 170 and metal line 168 are formed within the second dielectric layer 162. Alternatively, an etch stop material 171 may be deposited near the interface of the via 170 and metal line 168, as shown in phantom.

Dielectric layer 162 is patterned and etched, generally in two separate steps to form via 170 holes and trenches for metal lines 168. The via 170 hole may be formed first, followed by the formation of metal line 168 trench, or vice versa. A metallic liner 164 must be deposited over the via hole and the metal line trench. The via openings and metal line trench are filled with a metallic material, preferably the same as the material used for the conductive lines 108, for example, to form vias 170 and metal lines 168.

Thus, in prior art processes, copper (or other metal) conductors to interconnect devices are formed in back-end-of-line (BEOL) processes using single- or dual-damascene techniques, and preferably use a dielectric with a low dielectric constant. Lithography followed by dry-etch steps create vias and trenches in the dielectric layer. In production processes, vias and trenches are often produced using via-first methods wherein a first lithographic process creates a via pattern to etch down to a metallic layer below a dielectric layer, and a second lithographic process creates a trench pattern co-aligned with the via. Via-first methods employ an OPL (organic planarizing layer) to fill the vias and to provide a level surface for the following trench lithography. After the trench is patterned, exposed, and etched, the organic planarizing material should be completely removed to prevent interference with following processes.

But a principal limitation of prior-art processes is the inability to form metallic interconnects with high-speed signal transmission characteristics and high reliability, particularly for devices with structures smaller than 100 nm and gate counts exceeding one million gates. State-of-the-art damascene patterning of the ILD (inter-layer dielectrics) using an RIE or other etching process induces ILD damage particularly adjacent to openings in the ILD patterns, resulting in an increased value for the dielectric constant in the surrounding dielectric region. Interconnect patterns with reduced dimensions generally result in an increased fraction of damaged dielectric material compared to non-damaged bulk dielectric material, and thus have an increased effective dielectric constant. A need thus exists for an improved process and method that can overcome these deficiencies by avoiding damage to the dielectric material during the dielectric patterning and etching processes for forming vias and trenches for metallic interconnects. The need is for a technology to produce metallic interconnects with low interline capacitance, preferably using low-k and ultra-low-k (porous) materials. The need for a damage-free approach is even more important for future generations of integrated circuits because higher density interconnect patterns with higher aspect ratios make it difficult to achieve thin and homogeneous liner coverage on via and trench sidewalls with state-of-the-art lithography.

SUMMARY OF THE INVENTION

These and other problems are generally solved or circumvented, and technical advantages are generally achieved, by preferred embodiments of the present invention which provide a metal interconnect structure and method.

In accordance with a preferred embodiment of the invention, a stenciling technique is employed to avoid direct etching of vias and trenches in an ILD (interlayer dielectric), which may be a low-k or ultra-low-k dielectric material, and thereby avoid the ILD damage ordinarily incurred during dielectric structuring. A stencil is deposited and structured, and the ILD is deposited around the stencil and planarized, e.g., by CMP. The stencil is removed by a wet etch, advantageously leaving a via or trench in the ILD without damage to the ILD. The process can also be applied to a CA module, which is a wafer with exposed metal contacts, such as tungsten-filled contacts, to underlying transistors or other components. The process relieves the need to structure small holes in an ILD, which is a critical problem using fine-line lithography that can be resolved using a stenciling approach. In a preferred embodiment, the lithographic pattern is effectively the inverse of the lithography ordinarily used for a damascene process. The small feature size of vias and trenches can be further enhanced by a stencil-trimming step during stencil structuring.

An embodiment of the invention is a method of fabricating a semiconductor device using a stenciling technique. The method includes providing a wafer including a conductive region, and depositing a liner over the conductive region. In a preferred embodiment, the method includes using tantalum nitride for the liner. The method further includes depositing a stencil layer over the liner. In a preferred embodiment, the method includes using polysilicon to form the stencil layer. The method further includes etching the stencil layer and the liner to form a stencil pattern for a conductive layer that will be deposited in the space left behind after removal of the stencil pattern in a later processing step. In a preferred embodiment, the stencil layer and the liner are etched with a reactive-ion etch. In a preferred embodiment, the method includes using an etching process that does not substantially etch the liner under the stencil pattern. In a further preferred embodiment, the method includes depositing a second liner over exposed surfaces of the stencil pattern and removing exposed substantially horizontal surfaces of the second liner by a sputtering process. In a preferred embodiment, the method includes using argon in the sputtering process. In a preferred embodiment, the liner and the second liner comprise substantially the same material. The method further includes depositing a dielectric layer over the wafer. In a preferred embodiment, the dielectric layer comprises a low-k dielectric. In a preferred embodiment, the method further includes planarizing the wafer down to the stencil pattern and removing the stencil pattern with a wet etch to form an aperture in the wafer. In a preferred embodiment, the method includes planarizing the wafer down to the stencil pattern by chemical-mechanical polishing. In a further preferred embodiment, the method includes using dilute hydrofluoric acid to etch the aperture in the wafer. In a preferred embodiment, the method includes exposing the liner and remaining portions of the second liner in the aperture by the etching process. In a preferred embodiment, the method includes depositing metal in the aperture and replanarizing the surface of the wafer by chemical-mechanical polishing. In a preferred embodiment, the deposited metal is copper. In a further preferred embodiment, the method includes depositing a dielectric cap layer over the wafer after replanarizing the surface of the wafer.

Embodiments of the invention are useful since they are especially tailored for use with low-k and ultra-low-k dielectrics. Low-k and ultra-low-k dielectrics can be used to improve the capacitive signaling delay in the chip level interconnect arrangement. Use of aspects of the invention can provide greater reliability and mechanical stability when using low-k and ultra-low-k dielectric materials, since these materials ordinarily exhibit damage after the lithographic and etching steps to form vias and trenches in an ILD after the ILD is deposited.

In another aspect, the invention provides improved electrical conductivity between levels of metal since liners with improved structure for vias and trenches for the metal interconnect arrangement can be used for fabricating integrated circuits with fine-line dimensions less than 100 nm.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the invention provides many applicable inventive concepts that can be embodied in a wide variety of specific contexts. The specific embodiments discussed are merely illustrative of specific ways to make and use the invention, and do not limit the scope of the invention.

The invention will be described with respect to preferred embodiments in a specific context, namely a metallization scheme for an integrated circuit using a single-damascene interconnect process with a disposable stencil. The invention may also be applied, however, to other interconnect metallization schemes.

In a preferred embodiment, a stenciling technique is used to avoid the need to etch the interlayer dielectric, which may be a low-k or ultra-low-k material, to form apertures for deposition of the metallic interconnects. The stenciling technique avoids the ILD damage ordinarily produced during dielectric structuring. A stencil is deposited and structured, the ILD is deposited around the stencil, and the stencil and the ILD are planarized, e.g., by CMP. Then the stencil is removed by a wet etch to produce vias and trenches in the ILD. This flow can also be applied for a CA module, where the structuring of small holes is a principal problem that can be resolved using a stenciling technique.

A preferred embodiment and method of forming an interconnect structure employing a disposable stencil is illustrated in FIGS. 3-10. These figures provide but one example of the process steps. As will be recognized by one of skill in the art, a number of alternatives can be used. Although an embodiment and method for fabricating this structure is illustrated in the figures, as will be explained below various modifications of the specific structure and process are possible.

Figure 1:
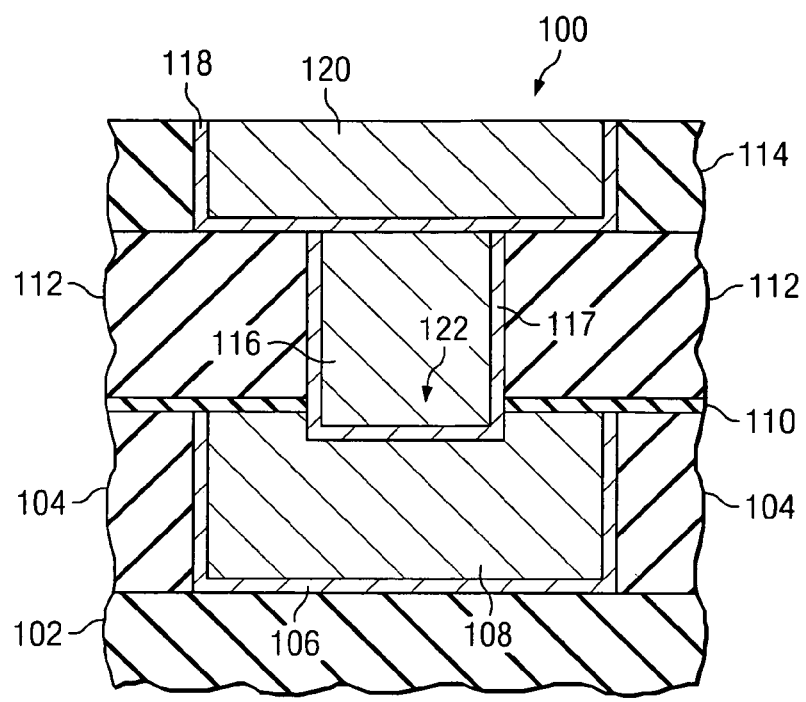
FIG. 1 illustrates a cross-sectional view of a prior art integrated circuit structure having vias connecting conductive lines of the various conductive layers in a single damascene approach.
Figure 2:
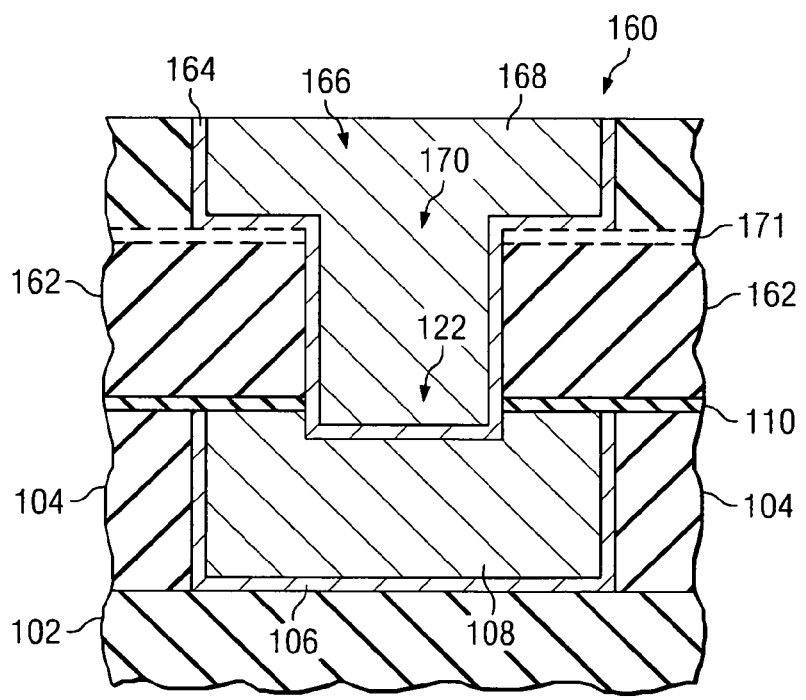
FIG. 2 illustrates a cross-sectional view of a prior art integrated circuit structure having vias connecting conductive lines of the various conductive layers in a dual damascene approach.
Figure 3:
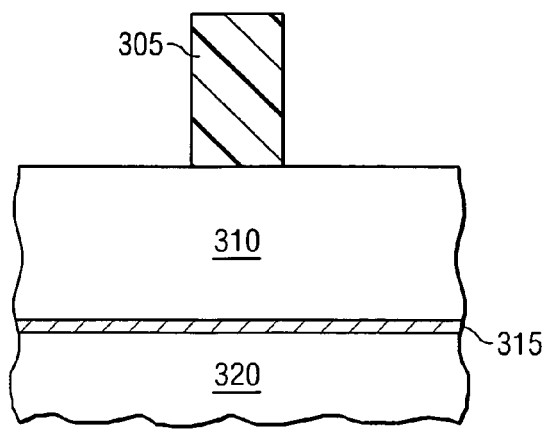
FIGS. 3-10 illustrate cross-sectional views of an integrated circuit during various stages of fabrication using a single-damascene process with a disposable stencil in an embodiment of the invention.

Referring first to FIG. 3, illustrated is a cross-sectional view of a partially fabricated integrated circuit showing a semiconductor substrate 320 formed over a semiconductor wafer. While not illustrated, the semiconductor substrate typically includes a number of active and passive circuit components formed in a semiconductor body, and may include metal layers such as copper layers to interconnect the active and passive circuit components. The semiconductor body can be a bulk substrate (e.g., monocrystalline silicon) or a (SOI) semiconductor-over-insulator layer, as just two examples. The active circuit components preferably comprise transistors. The passive components preferably comprise circuit elements such as diodes, resistors, and capacitors.

Above the substrate and 320 is a liner 315 preferably comprising a double layer of tantalum nitride and tantalum to prevent copper migration into a dielectric layer deposited thereabove, and to prevent oxygen migration into copper vias and lines. For example, when a copper interconnect is used, the liner may be a metallic or dielectric material such as tantalum, tantalum nitride, titanium, titanium nitride, titanium tungsten, tungsten nitride, ruthenium, iridium or platinum. A layer 310 of polysilicon is deposited above the liner to form the stencil that will be deposited thereon. Other materials can be employed for the stencil such as silicon dioxide. A photoresist is deposited above the stenciling layer 310, which is patterned, exposed, and developed to form the remaining resist structure 305 that will be used to locate vias and lines for the circuit interconnect structure. The vias provide electrical connections between layers of conductive lines. The pattern of the vias and lines for the circuit interconnects is determined by the circuit design and the desired interconnections.

Figure 4:
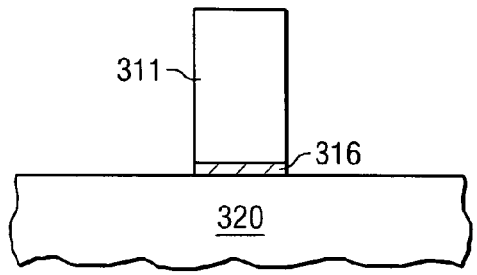

As illustrated in FIG. 4, the polysilicon layer 310 is etched with a process such as an RIE, and the remaining photoresist and the exposed liner are stripped off, leaving the polysilicon stencil 311. The liner 316 under the polysilicon stencil 311 is substantially unaffected by the RIE.

Figure 5:
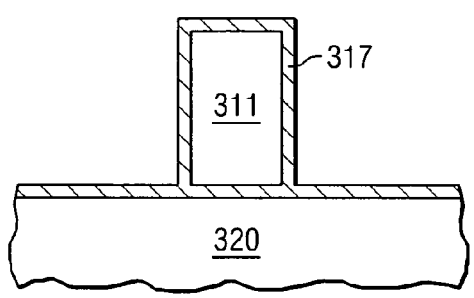

Turning now to FIG. 5, a further liner 317 is deposited over the exposed surfaces of the wafer, including the stencil 311. Preferably, the same liner material is deposited as was employed to form the liner under the stencil 311. The liner can be deposited with conventional processing methods such as PVD (physical vapor deposition).

Figure 6:
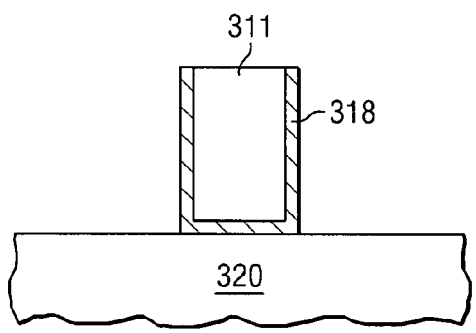

As illustrated in FIG. 6, exposed horizontal surfaces of the liner are removed, preferably by a selective sputtering process. The sputtering process is selective in that the liner 318 substantially remains over the sidewall surfaces of the stencil 311. While the liner 318 may be thinned at these locations, it preferably will not be removed. The sputtering process can be controlled by adjusting the electric field intensity applied to the ionized sputtering gas, i.e., by adjusting the applied sputtering voltage, to produce an anisotropic etch with selectivity for removing material from horizontal but not vertical surfaces. In a preferred embodiment, argon gas is used in the sputtering process. In a further preferred embodiment, an additional chemical substance such as oxygen is added to the argon gas to improve selectivity for removing material from horizontal surfaces. The result is a liner 318 remaining on walls of the stencil 311 and between the stencil and the substrate 320.

In one specific embodiment, the selective sputtering process uses the following parameters:
  600 sccm Ar,
  3000 W LF ignition power.
  1250 W LF,
  1500 W HF,
  300 sccm BSG,
  temperature <350° C.; and
  low pressure (e.g., 5·10-7 torr).

Figure 7:
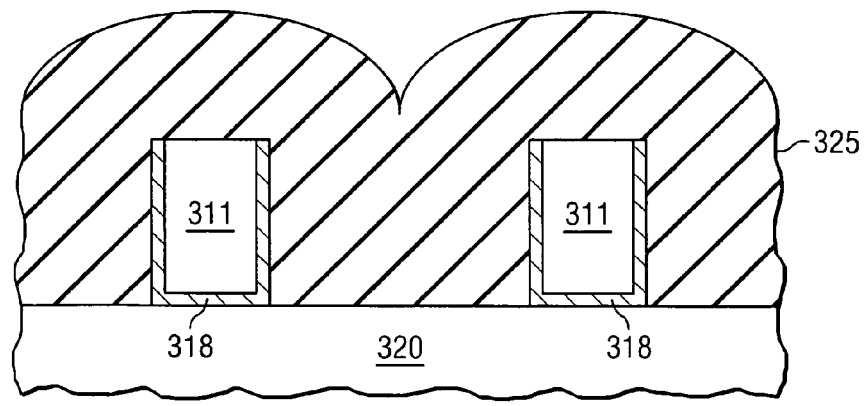

Turning now to FIG. 7, a dielectric layer 325, preferably a low-k or ultra-low-k dielectric, is deposited over upper exposed surfaces of the substrate. The dielectric can be deposited by CVD (chemical vapor deposition) or by a spin-on technique such as by using Low k Flowfill™ from Trikon Technologies. In a preferred embodiment, the dielectric is porous SiCOH. CVD deposition techniques often result in an uneven upper surface of the wafer as illustrated in the figure, but spin-on techniques can produce a more planar upper dielectric surface.

Figure 8:
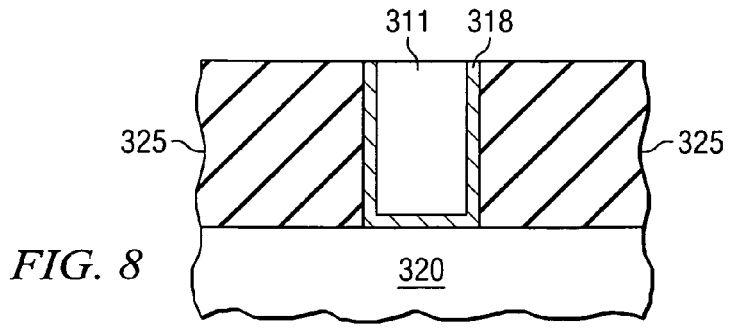

A planarizing process, preferably a CMP process, is applied to the wafer to polish the ILD (interlayer dielectric) down to the upper surface of the stencil, as illustrated in FIG. 8, thereby producing a planar upper surface of the stencil and the ILD. Stencils such as those formed with polysilicon provide good mechanical support for polishing the ILD with a CMP process.

Figure 9:
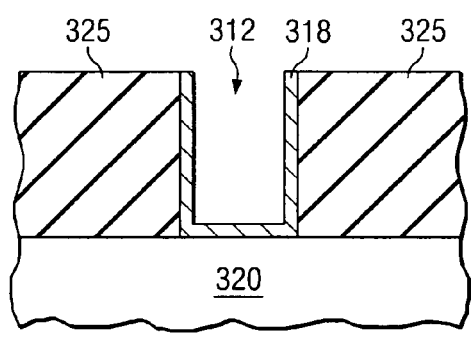
Figure 10:
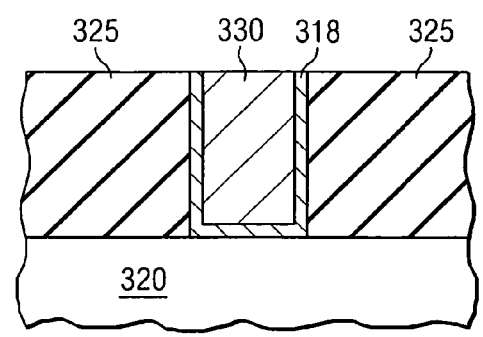

As illustrated in FIG. 9, the stencil is removed to produce apertures 312 in the ILD 325. The stencil is preferably removed using a wet etch such as 20 parts by volume nitric acid ($HNO_3$)+20 parts by volume acetic acid ($CH_3COOH$)+1 part by volume hydrofluoric acid (HF), advantageously producing well-formed sidewalls and bottom in the apertures 312. Another option for a wet etch is KOH at a temperature of about 75° C. A wet etch of the stencil with high selectivity for removing substantially only stencil material can be performed with minimal ILD damage and with minimal ILD reshaping. The alternative of using an RIE to open vias and trenches in an ILD generally results in substantial ILD damage and substantial reshaping of exposed ILD surfaces As illustrated in FIG. 10, metal lines or vias are deposited in the apertures created in the ILD to provide conductive material for desired circuit interconnects. Preferably, to achieve high electrical conductivity, the apertures are plated with copper. In other embodiments, the metal lines can be filled with a different metal such as aluminum, tungsten, or gold. The plating process may use a seeding process to initiate plating, but preferably a direct plating process is used without seeding. A seeding layer inherently narrows the width of a trench or via, which may be problematic in fine-line geometries below 100 nm, e.g., 90 nm, 65 nm, 45 nm, or smaller. A planar surface of the wafer can be produced by a further CMP process.

Figure 11:
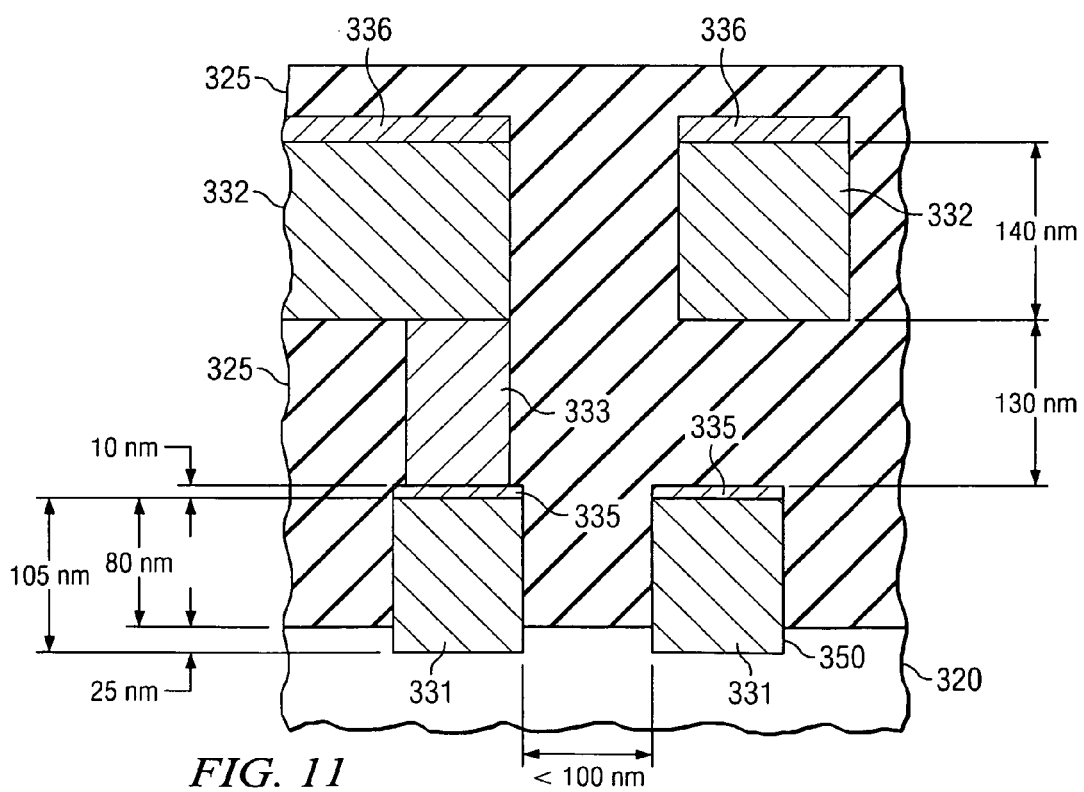
FIG. 11 illustrates a cross-sectional view of an integrated circuit interconnect structure of an embodiment of the invention showing typical dimensions for an interconductor spacing less than 100 nm.

FIG. 11 shows a cross-sectional view of a portion of a semiconductor wafer to illustrate typical dimensions of an interconnect structure with an interconnect line spacing of approximately 100 nm. In the lower portion of the figure, a substrate 320 comprises semiconductor layers, dielectric layers, and conductive metal layers. A dielectric layer in substrate 320 may comprise silicon dioxide formed from TEOS (tetraethylorthosilicate) deposited such as by SACVD (selective area chemical vapor deposition) or any dielectric material such as a doped oxide (e.g., PSG, BPSG, FSG, or BSG). In a preferred embodiment, a dielectric layer comprises a low-k dielectric. In this context, a low-k dielectric, which can be either porous or non-porous, is a dielectric that has a dielectric constant less than the dielectric constant of undoped silicon dioxide. The low-k dielectric material can be an organic spin-on material such as a JSR5109 or others. Examples of porous low-k dielectric include SiLK™ available from Dow Chemical Company and Flare™ available from AlliedSignal, Inc. In further preferred embodiments, the dielectric is formed from SiCOH, either dense SiCOH or porous SiCOH (pSiCOH).

Copper traces 331 are illustrated such as may be formed for a first metal interconnect layer referred to as "M1". (It is understood, however, that the substrate 320 could include additional metal layers such that traces 331 are an upper metallization.) Liners around copper traces that may be desired to prevent copper and oxygen migration are omitted from the figure to simplify the drawing. Copper traces such as traces 331 are surrounded by ILD 325, preferably a low-k ILD such as OMCTS (octamethylcyclotetrasiloxane) which has a relative dielectric constant of about 2.7 and which may be grown by PECVD (microwave plasma enhanced chemical vapor deposition). Above the copper trace 331 a metal cap layer 335 is selectively deposited. The metal cap layer comprises CoWP, as described in co-pending application "Method of Making a Semiconductor Interconnect with a Metal Cap," application Ser. No. 11/079,843, filed Mar. 14, 2005, which is hereby referenced and incorporated herein. The metal cap layer is selectively deposited only on the underlying metal structures, such as copper structures. Alternatively, a dielectric cap (not shown), e.g., that covers the entire surface of metal 331 and adjacent dielectric, can be used.

A via such as via 333 couples the overlying metal interconnect layer 332, such as a second metal layer referred to as "M2", with the lower metal interconnect layer 331, such as a first metal layer M1. The metal layer M2 preferably comprises the same material (e.g., copper) as the metal layer M1 and the via, and preferably physically contacts the conductive via 333. A dielectric cap layer 336 preferably covers metal layer 332. If desired, further metal interconnect and dielectric layers for an interconnect structure can be formed above the dielectric cap layer 336. For example, an integrated circuit can have six or more metal layers, each of which is formed by the process described herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a semiconductor device, the method comprising:
   providing a wafer that includes a conductive region, the wafer comprising a top surface;
   depositing a first conductive liner over the top surface of the wafer;
   forming a stencil pattern over the wafer, wherein the first conductive liner is removed from over the top surface of the wafer except under the stencil pattern;
   conformally depositing a second conductive liner over the stencil pattern;
   etching the second conductive liner to form sidewalls around the stencil pattern;
   after etching the second conductive liner, depositing a dielectric layer over the wafer;
   planarizing the dielectric layer down to the stencil pattern;
   removing the stencil pattern to form an aperture, wherein the aperture exposes the first conductive liner and the second conductive liner; and
   depositing a conductor in the aperture to form a conductive layer.

2. The method of claim 1 wherein planarizing the dielectric layer comprises planarizing the dielectric layer by chemical-mechanical polishing.

3. The method of claim 1 wherein the first conductive liner and the second conductive liner comprise substantially the same material.

4. The method of claim 1 wherein the stencil pattern comprises polysilicon.

5. The method of claim 1 wherein the dielectric layer comprises a low-k dielectric.

6. The method of claim 5 wherein the dielectric layer comprises a porous low-k dielectric.

7. The method of claim 6 wherein the dielectric layer comprises pSiCOH.

8. The method of claim 1 wherein depositing the dielectric layer comprises applying the dielectric layer with a spin-on technique.

9. The method of claim 1 wherein removing the stencil pattern comprises performing a wet etch using dilute hydrofluoric acid.

10. The method of claim 1 wherein depositing the conductor comprises depositing metal.

11. The method of claim 10 wherein the first conductive liner comprises a double layer of tantalum nitride and tantalum.

12. The method of claim 11 wherein etching the second conductive liner comprises removing exposed substantially horizontal surfaces of the second conductive liner by a selective sputtering process.

13. The method of claim 12 wherein removing exposed substantially horizontal surfaces of the second conductive liner comprises removing the second conductive liner by selective sputtering with argon.

14. The method of claim 10 wherein depositing metal in the aperture comprises depositing copper.

15. The method of claim 10 wherein depositing metal in the aperture comprises plating.

16. The method of claim 10 further comprising replanarizing the top surface of the wafer by chemical-mechanical polishing after depositing metal in the aperture.

17. The method of claim 16 further comprising depositing a dielectric cap layer over the wafer after replanarizing the top surface of the wafer.

18. The method of claim 16 further comprising forming a metal cap layer over the replanarized metal.

19. The method of claim 1 wherein forming the stencil pattern over the wafer comprises forming the stencil pattern over the conductive region.

20. The method of claim 19 wherein forming the stencil pattern over the wafer comprises:
    depositing the first conductive liner over the conductive region;
    depositing a stencil layer over the first conductive liner; and
    etching the stencil layer and the first conductive liner to form the stencil pattern for the conductive layer, wherein the first conductive liner under the stencil pattern is not substantially etched.

21. The method of claim 20 wherein etching the stencil layer and the first conductive liner comprises etching the stencil layer and the first conductive liner with a reactive-ion etch.

22. A method of fabricating a semiconductor device, the method comprising:
    depositing a first conductive liner over a conductive region of a wafer;
    depositing a stencil layer over the first conductive liner;
    etching the stencil layer and the first conductive liner to form a stencil pattern for a conductive layer, wherein the first conductive liner under the stencil pattern is not substantially etched, and wherein the first conductive liner around the stencil pattern is removed;
    depositing a second conductive liner over the wafer;
    removing exposed substantially horizontal surfaces of the second conductive liner by sputtering with argon;
    depositing a low-k dielectric layer over the wafer;
    planarizing the wafer down to the stencil pattern by chemical-mechanical polishing;
    removing the stencil pattern with a wet etch to form an aperture in the wafer exposing the first conductive liner and remaining portions of the second conductive liner;
    depositing metal in the aperture; and
    replanarizing a surface of the wafer by chemical-mechanical polishing after depositing metal in the aperture.

23. A method of forming a conductor in an integrated circuit, the method comprising:
    forming a first conductive liner over a conductive region;
    forming a second conductive liner over the conductive region, the second conductive liner disposed perpendicular to the first conductive liner and extending upwardly away from the conductive region;
    after forming the first and second conductive liners, forming an interlevel dielectric layer that surrounds the second conductive liner;
    after forming the interlevel dielectric layer, forming an aperture bounded by the first and second conductive liners; and
    forming a conductor over the conductive region, the conductor being surrounded by the interlevel dielectric layer such that the second conductive liner is disposed between the interlevel dielectric layer and the conductor, and the first conductive liner is disposed between the conductor and the conductive region.

24. The method of claim 23 wherein the first conductive liner comprises tantalum.

25. The method of claim 23 wherein the interlevel dielectric layer comprises a low-k dielectric.

26. The method of claim 23 wherein the interlevel dielectric layer comprises pSiCOH.

27. The method of claim 23 further comprising forming a sacrificial stencil structure, wherein forming the second conductive liner comprises forming the second conductive liner along sidewalls of the sacrificial stencil structure.

28. The method of claim 27 further comprising removing the sacrificial stencil structure after forming the interlevel dielectric layer but before forming the conductor.

* * * * *